US009728577B2

(12) United States Patent
Inada et al.

(10) Patent No.: US 9,728,577 B2
(45) Date of Patent: Aug. 8, 2017

(54) INFRARED IMAGE SENSOR

(71) Applicant: SUMITOMO ELECTRIC INDUSTRIES, LTD., Osaka (JP)

(72) Inventors: Hiroshi Inada, Yokohama (JP); Sundararajan Balasekaran, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 106 days.

(21) Appl. No.: 14/855,016

(22) Filed: Sep. 15, 2015

(65) Prior Publication Data

US 2016/0087000 A1    Mar. 24, 2016

(30) Foreign Application Priority Data

Sep. 24, 2014 (JP) ................................ 2014-194187

(51) Int. Cl.
| | |
|---|---|
| *H01L 27/146* | (2006.01) |
| *H01L 31/0304* | (2006.01) |
| *H01L 31/0352* | (2006.01) |

(52) U.S. Cl.
CPC .... *H01L 27/14652* (2013.01); *H01L 27/1469* (2013.01); *H01L 27/14634* (2013.01); (Continued)

(58) Field of Classification Search
CPC ............................................... H01L 27/14652
See application file for complete search history.

(56) References Cited

U.S. PATENT DOCUMENTS 6,407,374 B1 * 6/2002 Sato .................. H01L 27/14601
250/208.1
6,407,439 B1 * 6/2002 Hier ....................... B82Y 20/00
257/431

(Continued)

FOREIGN PATENT DOCUMENTS

| JP | 2546407 | 10/1996 |
|---|---|---|
| JP | 4721147 | 7/2011 |

OTHER PUBLICATIONS

H. Inada, K. Miura, H. Mori, Y. Nagai, Y. Iguchi, and Y. Kawamura, "Uncooled SWIR InGaAs/GaAsSb type II quantum wells focal plane array", Proc. of SPIE, vol. 7660, 76603N (2010).

*Primary Examiner* — Christine Sung
(74) *Attorney, Agent, or Firm* — Smith, Gambrell & Russell, LLP.

(57) ABSTRACT

An infrared image sensor includes a bias circuit receiving a timing signal, the bias circuit generating a bias voltage having a first value and a second value in response to the timing signal; a semiconductor light-receiving device including a photodiode, the semiconductor light-receiving device receiving the bias voltage; a read-out circuit including a read-out electrode connected to the photodiode, the read-out electrode receiving an electrical signal from the photodiode; and a signal processing circuit processing a read-out signal from the read-out circuit synchronously with the timing signal. The photodiode includes an optical absorption layer made of a III-V group compound semiconductor. The optical absorption layer has a type II multi quantum well structure including first compound semiconductor layers containing antimony as a constituent element and second compound semiconductor layers that are stacked alternately.

11 Claims, 4 Drawing Sheets

(52) U.S. Cl.
CPC .. *H01L 27/14694* (2013.01); *H01L 31/03046* (2013.01); *H01L 31/035236* (2013.01)

(56) References Cited

U.S. PATENT DOCUMENTS

| | | | | |
|---|---|---|---|---|
| 7,652,252 | B1 * | 1/2010 | Rajavel | G01J 3/2803 |
| | | | | 250/338.4 |
| 7,868,935 | B2 * | 1/2011 | Egawa | H04N 5/361 |
| | | | | 348/243 |
| 2005/0001151 | A1 * | 1/2005 | Nakazawa | H04B 10/6911 |
| | | | | 250/214 R |
| 2008/0204822 | A1 * | 8/2008 | Yamamoto | H04N 5/335 |
| | | | | 358/482 |
| 2014/0291479 | A1 * | 10/2014 | Lu | H01L 31/035218 |
| | | | | 250/200 |
| 2015/0288907 | A1 * | 10/2015 | Vampola | H01L 27/14643 |
| | | | | 250/208.1 |

* cited by examiner

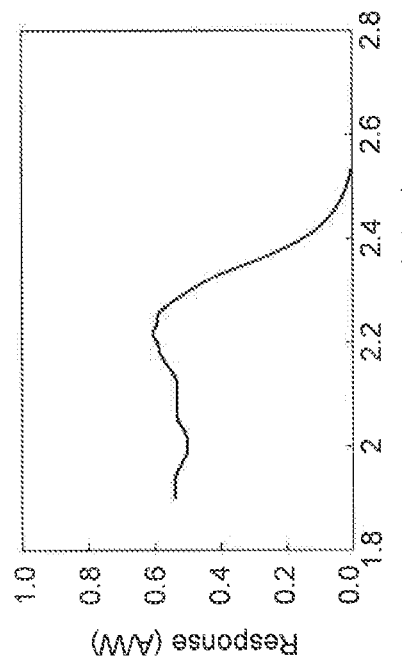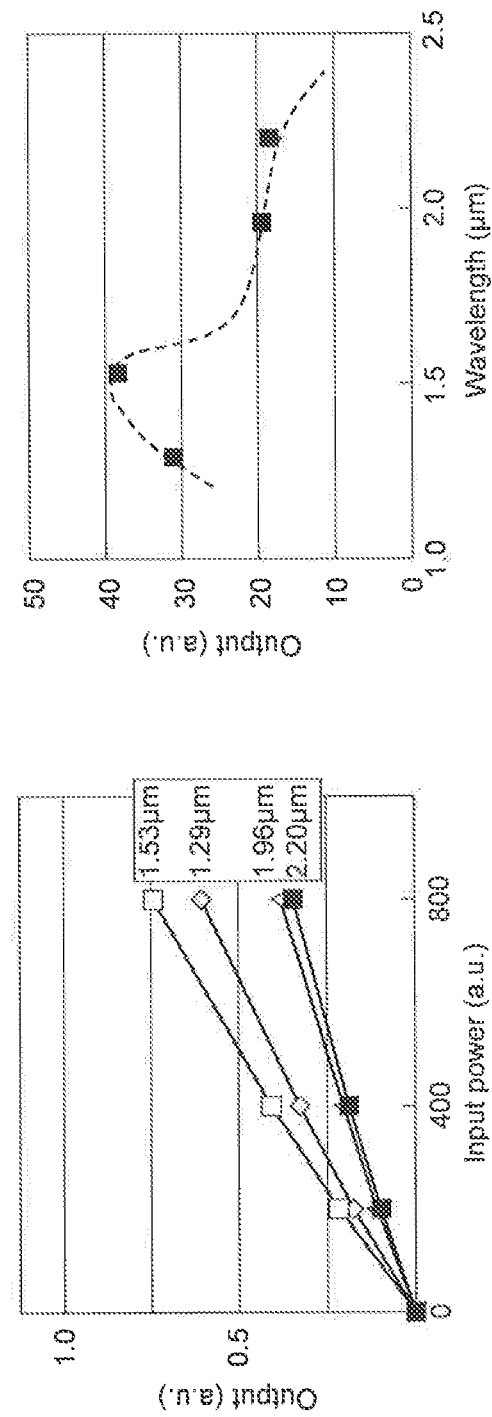
FIG. 4A
FIG. 4B
FIG. 4C

INFRARED IMAGE SENSOR

BACKGROUND OF THE INVENTION

1. Field of the Invention

The present invention relates to an infrared image sensor.

2. Description of the Related Art

Japanese Patent No. 2546407 discloses a hybrid element that includes a bump bonding electrode electrically connecting a pair of semiconductor chips facing each other through a bump. Japanese Patent No. 4721147 discloses a biogenic substance detector. The biogenic substance detector includes a semiconductor light-receiving device having a photosensitivity to light in the near-infrared. A literature "H. Inada, K. Miura, H. Mori, Y. Nagai, Y. Iguchi, and Y. Kawamura, "Uncooled SWIR InGaAs/GaAsSb type II quantum wells focal plane array", Proc. of SPIE, Vol. 7660, 76603N" discloses a focal plane array detector. This focal plane array detector has an InGaAs/GaAsSb multi quantum well (MQW) structure.

SUMMARY OF THE INVENTION

A semiconductor light-receiving device (photodiode) having a sensitivity to light in the near-infrared region includes an optical absorption layer having, for example, an InGaAs/GaAsSb type II multi quantum well (MQW) structure. This InGaAs/GaAsSb type II multi quantum well structure has a sensitivity to infrared light having a wavelength of 1.7 to 2.5 μm based on the type II transition in the type II quantum well structure. Furthermore, the photodiode having the InGaAs/GaAsSb type II multi quantum well structure also has a sensitivity to light having a wavelength shorter than 1.7 μm, for example, light of 1.5 μm based on the interband transition of electrons in the InGaAs semiconductor layer, for example. When this photodiode receives incident light having a wide spectrum, the output signal (photocurrent) includes both a photocurrent component caused by light of 1.7 to 2.5 μm and a photocurrent component caused by light of 1.5 μm. When signal light is composed of only infrared light having a wavelength of 1.7 to 2.5 μm, light of 1.5 μm wavelength is noise light for the signal light. If an output signal (photocurrent) of a photodiode includes both a photocurrent component caused by signal light of 1.7 to 2.5 μm and a photocurrent component caused by non-signal light (noise light) of 1.5 μm, the S/N ratio of the output signal is deteriorated. It is required to extract only photocurrent components caused by light of, for example, 1.7 to 2.5 μm, in order to improve the S/N ratio of the output signal.

An infrared image sensor according to an aspect of the present invention includes a bias circuit receiving a timing signal, the bias circuit generating a bias voltage having a first value and a second value in response to the timing signal; a semiconductor light-receiving device including a photodiode, the semiconductor light-receiving device receiving the bias voltage; a read-out circuit including a read-out electrode connected to the photodiode, the read-out electrode receiving electrical signal from the photodiode; and a signal processing circuit processing a read-out signal from the read-out circuit synchronously with the timing signal. The photodiode includes an optical absorption layer made of a ITT-V group compound semiconductor. In addition, the optical absorption layer has a type II multi quantum well structure including first compound semiconductor layers containing antimony as a constituent element and second compound semiconductor layers that are stacked alternately.

The above-mentioned and other purposes, features, and advantages of the present invention will become more apparent by detailed description of preferred embodiments of the present invention with reference to the accompanying drawings.

BRIEF DESCRIPTION OF THE DRAWINGS

FIGS. 4A to 4C are diagrams showing optical characteristics of a type II multi quantum well structure according to an embodiment.

DESCRIPTION OF THE PREFERRED EMBODIMENTS

Figure 1:
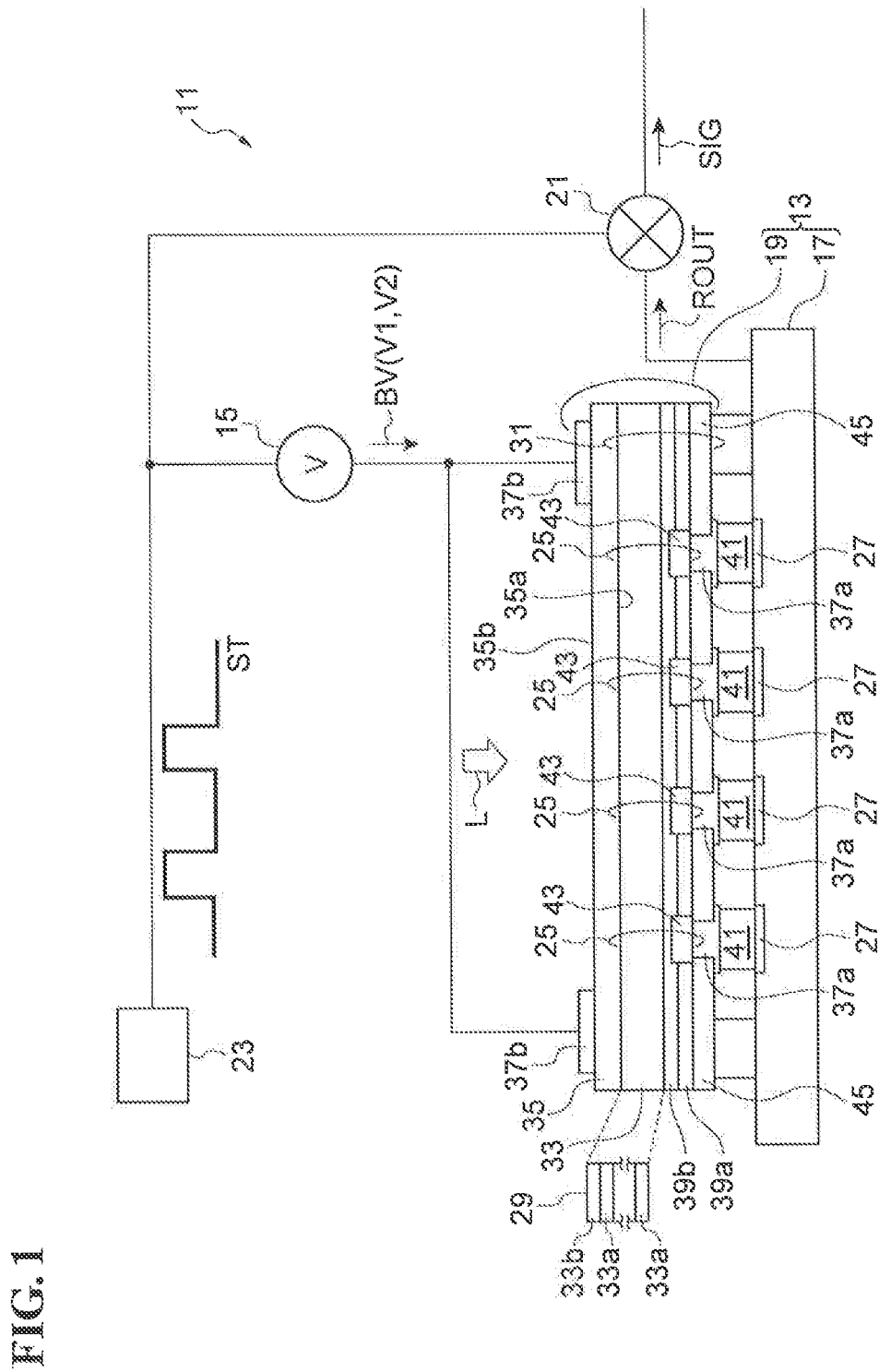
FIG. 1 is a diagram schematically illustrating an infrared image sensor according to an embodiment.

First, embodiments of the present invention will be listed and described.

An infrared image sensor according to an embodiment includes (a) a bias circuit receiving a timing signal, the bias circuit generating a bias voltage having a first value and a second value in response to the timing signal; (b) a semiconductor light-receiving device including a photodiode, the semiconductor light-receiving device receiving the bias voltage; (c) a read-out circuit including a read-out electrode connected to the photodiode, the read-out electrode receiving electrical signal from the photodiode; and (d) a signal processing circuit processing a read-out signal from the read-out circuit synchronously with the timing signal. The photodiode includes an optical absorption layer made of a III-V group compound semiconductor. In addition, the optical absorption layer has a type II multi quantum well structure including first compound semiconductor layers containing antimony as a constituent element and second compound semiconductor layers that are stacked alternately.

In an infrared image sensor according to an embodiment, the optical absorption layer preferably generates a photocurrent component due to a type II transition in the type II multi quantum well structure. The photocurrent component due to the type II transition varies according to the first value and the second value of the bias voltage applied to the photodiode. The signal processing circuit provides a difference between a read-out signal at a bias voltage of the first value and a read-out signal at a bias voltage of the second value so as to output a differential signal.

In this infrared image sensor, the photocurrent component according to the type IT transition in the optical absorption layer of the photodiode varies depending on the bias value applied to the photodiode. When the semiconductor light-receiving device is applied with a bias voltage having a first value and a second value generated synchronously with the timing signal, the photocurrent is modulated synchronously with the timing signal. Since the signal processing circuit processes a read-out signal from the read-out circuit synchronously with the timing signal, the photocurrent component according to the type II transition is read out in a form that is distinguished from the other photocurrent component that is almost constant without depending on the bias voltage.

In an infrared image sensor according to an embodiment, the first compound semiconductor layer may be made of GaAsSb, and the second compound semiconductor layer may be made of InGaAs. In this infrared image sensor, the type II transition is generated in a multi quantum well structure so as to have a sensitivity to infrared light having a wavelength of 1.7 to 2.5 μm.

In an infrared image sensor according to an embodiment, the semiconductor light-receiving device may include a semiconductor mesa disposed on a first conductive type semiconductor substrate, the semiconductor mesa defining the photodiode. The semiconductor mesa may include a second conductive type spacer layer disposed on the optical absorption layer and a second conductive type cap layer disposed on the spacer layer.

In an infrared image sensor according to an embodiment, the spacer layer may be made of InGaAs, and the cap layer may be made of InP.

In an infrared image sensor according to an embodiment, the semiconductor light-receiving device may include a first conductive type semiconductor substrate, a first conductive type spacer layer disposed on the optical absorption layer, a first conductive type cap layer disposed on the spacer layer, and a second conductive type semiconductor region disposed in the spacer layer and the cap layer. The optical absorption layer may be disposed between the semiconductor substrate and the spacer layer. Preferably, the second conductive type semiconductor region is extended from the cap layer to the spacer layer, the second conductive type semiconductor region defining the photodiode.

In an infrared image sensor according to an embodiment, the second conductive type semiconductor region may be formed by impurity diffusion of a p-type dopant.

In an infrared image sensor according to an embodiment, the semiconductor light-receiving device may include a plurality of photodiodes that are one-dimensionally or two-dimensionally arranged in an array. The read-out circuit may include a plurality of read-out electrodes connected to the corresponding photodiodes, each of the read-out electrodes receiving electrical signal from at least one of the photodiodes.

In an infrared image sensor according to an embodiment, the semiconductor light-receiving device may include a plurality of semiconductor mesas disposed on a first conductive type semiconductor substrate, each of the semiconductor mesas defining at least one of the plurality of photodiodes. The semiconductor mesa may include a second conductive type spacer layer disposed on the optical absorption layer and a second conductive type cap layer disposed on the spacer layer. In this infrared image sensor, the semiconductor mesas isolate the individual photodiodes from one another.

In an infrared image sensor according to an embodiment, the semiconductor light-receiving device may include a first conductive type semiconductor substrate, a first conductive type spacer layer disposed on the optical absorption layer, a first conductive type cap layer disposed on the spacer layer, and a plurality of second conductive type semiconductor regions disposed in the spacer layer and the cap layer. The optical absorption layer may be disposed between the semiconductor substrate and the spacer layer. Each of the second conductive type semiconductor regions may be extended from the cap layer to the spacer layer, each of the second conductive type semiconductor regions defining at least one of the plurality of photodiodes. The plurality of photodiodes may be electrically isolated from one another by p-n junctions disposed between the second conductive type semiconductor regions and first conductive type semiconductor layers including the cap layer and the spacer layer.

The findings of the present invention can be readily comprehended by considering the following detailed description with reference to the accompanying drawings shown as exemplifications. Subsequently, with reference to the accompanying drawings, embodiments of the present invention relating to an infrared image sensor, a semiconductor light-receiving device, a read-out circuit, and a light-receiving apparatus will be described. If possible, the same part is denoted by the same reference symbol.

FIG. 1 is a diagram schematically showing an infrared image sensor according to an embodiment. The infrared image sensor 11 includes a bias circuit 15, a read-out circuit 17, a semiconductor light-receiving device 19, and a signal processing circuit 21. The bias circuit 15 generates a bias voltage BV by responding to a timing signal ST applied from a timing circuit 23. The bias voltage BV has a first value V1 and a second value V2. The semiconductor light-receiving device 19 includes a plurality of photodiodes 25. The plurality of photodiodes 25 is one-dimensionally or two-dimensionally arrayed. The semiconductor light-receiving device 19 receives the bias voltage BV, and this bias voltage BV is applied to the individual photodiodes 25. The read-out circuit 17 includes a plurality of read-out electrodes 27. These read-out electrodes 27, respectively, receive the electrical signals from the plurality of photodiodes 25 arranged in an array. The signal processing circuit 21 processes the read-out signals from the read-out electrodes 27 synchronously with the timing signal ST.

Each of the photodiodes 25 of the semiconductor light-receiving device 19 includes a stacked semiconductor layer 31 for photoelectric conversion. Specifically, the stacked semiconductor layer 31 includes an optical absorption layer 33 of a III-V group compound semiconductor. The optical absorption layer 33 has, for example, a multi quantum well (MQW) structure 29. The quantum well structure 29 includes a structure composed of first compound semiconductor layers 33a and second compound semiconductor layers 33b that are alternately stacked. The first compound semiconductor layer 33a contains antimony as a constituent element, for example. The second compound semiconductor layer 33b is made of a material different from the material of the first compound semiconductor layer 33a. This quantum well structure 29 has a type II band structure. The stacked semiconductor layer 31 is disposed on the principal surface 35a of a substrate 35. The photodiodes 25 of the semiconductor light-receiving device 19 receive light L passed through the substrate 35. The substrate 35 includes an InP substrate. The substrate 35 is, for example, an n-type InP substrate (dopant: S, impurity concentration: 1.0 to $8.0 \times 10^{18}$ $cm^{-3}$). A first electrode 37a is disposed on the stacked semiconductor layer 31 of each photodiode 25. The first electrode 37a is one of an anode electrode and a cathode electrode of the photodiode 25. Second electrode 37b is disposed on a reverse surface 35b of the substrate 35. The second electrode 37b is the other of the anode electrode and the cathode electrode. The reverse surface 35b of the substrate 35 is on the opposite side of the principal surface 35a. If necessary, an anti-reflection (AR) coating film is disposed on the reverse surface 35b in order to reduce reflection of light at the reverse surface 35b of the substrate 35, and in order to enter light efficiently into the optical absorption layer 33 through the substrate 35. The first electrodes 37a are made of AuZn, and the second electrodes 37b are made of AuGeNi. In an embodiment, the stacked semiconductor layer 31 includes an optical absorption layer 33, a cap layer 39a, and a spacer layer 39b and also includes a buffer layer disposed on the principal surface 35a of the substrate 35.

The surface of the stacked semiconductor layer 31 is covered with a silicon-based inorganic insulating film 45, such as a silicon nitride (SiN) film. The silicon-based inorganic insulating film 45 has openings through which a top surface of the stacked semiconductor layer 31 (in the embodiment, the cap layer 39a) is exposed. The first electrodes 37a are formed in the openings of the silicon-based inorganic insulating film 45. The first electrodes 37a are in contact with the top surface of the stacked semiconductor layer 31 of each photodiode 25 through openings in the silicon-based inorganic insulating film 45.

An example of stacked semiconductor layer 31:
Optical absorption layer 33: GaAsSb/InGaAs multi quantum well (MQW) structure,
Spacer layer 39b: InGaAs, and
Cap layer 39a: InP.

The optical absorption layer 33 having a GaAsSb/InGaAs MQW structure, the spacer layer 39b of an InGaAs layer, and the cap layer 39a of an InP layer are grown on a semiconductor substrate in this order by using a molecular beam epitaxial growth (MBE) method, for example, A semiconductor light-receiving device 19 and a read-out circuit 17 (ROIC) constitute a light-receiving apparatus 13. The photodiodes 25 of the semiconductor light-receiving device 19 are each connected to the read-out electrode 27 of the read-out circuit 17 through a bump electrode 41. The bump electrode 41 is made of, for example, indium. The read-out circuit 17 includes a silicon integrated circuit (IC).

In this infrared image sensor 11, a bias voltage BV is applied to the semiconductor light-receiving device 19. The bias voltage BV is set to any of a plurality of predetermined values. A prescribed bias voltage BV is applied to the photodiode 25 in the semiconductor light-receiving device 19. The optical absorption layer 33 of the photodiode 25 has a type II quantum well structure and has a so-called type II band alignment. Depending on the bias voltage BV, the photocurrent related to the interband transition (hereinafter, referred to as type II transition) based on this type II band alignment is changed. The bias voltage BV includes a first value V1 and a second value V2, and transition from one of the first value V1 and the second value V2 to the other is caused synchronously with the timing signal ST. Accordingly, the photocurrent from the photodiode 25 is modified synchronously with the timing signal ST. Since the signal processing circuit 21 processes the read-out signal from the read-out circuit 17 synchronously with the timing signal ST, the photocurrent from the type II transition is identified from the photocurrents generated from other optical transition.

In the infrared image sensor 11, for example, the first compound semiconductor layer 33a is made of GaAsSb, and the second compound semiconductor layer 33b is made of InGaAs. In the infrared image sensor 11, the type II transition is generated in a multi quantum well (MQW) structure including a GaAsSb layer and an InGaAs layer. The quantum well structure 29 is not limited to the stacked layer structure of GaAsSb/InGaAs and may have a stacked layer structure of InP/GaAsSb.

Figure 2:
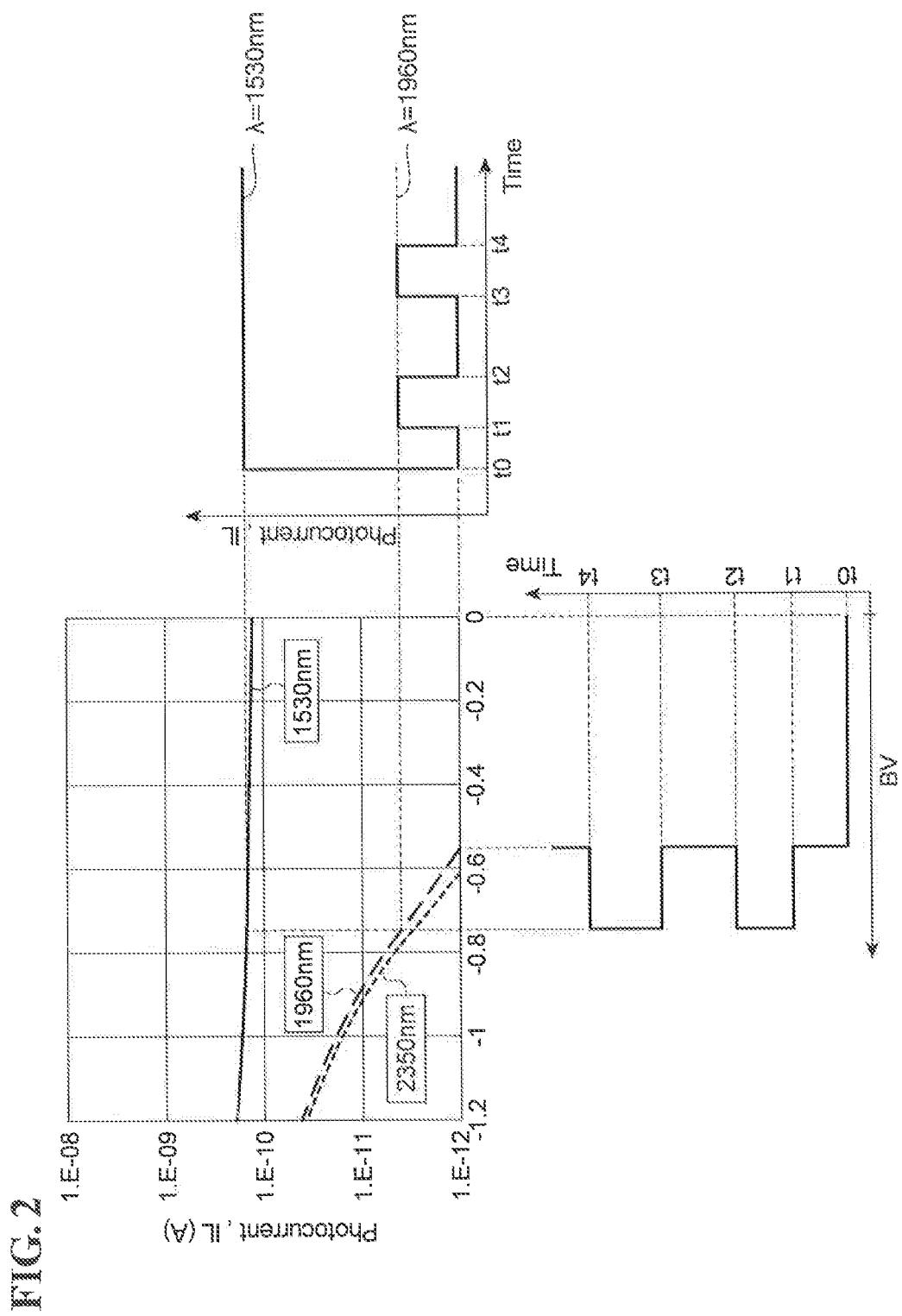
FIG. 2 is a diagram showing bias dependence of photocurrent IL.

FIG. 2 is a diagram showing bias dependence of photocurrent IL of the photodiode 25 including the optical absorption layer 33 having the type II quantum well structure. In the scale on the vertical axis in FIG. 2, for example, "1.E-10" indicates $1.0 \times 10^{-10}$. Specifically, the light L incident on the photodiode 25 is absorbed by the optical absorption layer 33 of the stacked semiconductor layer 31. As a result, a photocarrier is generated in the optical absorption layer 33. This photocarrier reaches the first electrode 37a of the photodiode 25 and is output as photocurrent IL into the read-out electrode 27 of the read-out circuit 17 through the bump electrode 41. The light L typically contains light components having wavelengths of 1530 nm, 1960 nm, and 2350 nm. FIG. 2 shows bias dependence of the photocurrent output from the photodiode 25 on the light containing these light components. The light intensities of these light components contained in light L are adjusted to be substantially the same. Among these light components, the photocurrent for the light having a wavelength of 1530 nm is almost constant in a bias voltage range of −1.2 to 0 volt, without depending on the bias voltage. In contrast, in light having a wavelength of 1960 nm or 2350 nm, the photocurrent relatively highly depends on the bias voltage in a bias voltage range of −1.2 to 0 volt. For example, in light having a wavelength of 1960 nm or 2350 nm, the photocurrent from the photodiode 25 is about $1 \times 10^{-12}$ A at a bias voltage of about −0.6 V, whereas the photocurrent is about $1 \times 10^{-12}$. A at a bias voltage of about −0.9 V. The sensitivity ratio (the ratio of change in photocurrent) of the photodiode 25 at the two bias voltages is 10 times or more, for instance. In light having a wavelength of 1530 nm, the sensitivity ratio (the ratio of change in photocurrent) of the photodiode 25 is about 10% or less, when the bias voltage changes from −0.6 V to −0.9 V. That is, the photocurrent of photodiode 25 for light having a wavelength of 1530 nm does not substantially change when the bias voltage is varied in the range of −1.2 to 0 volt.

In FIG. 2, the different bias dependence of the photocurrent on the light components having wavelengths of 1530 nm, 1960 nm, and 2350 nm is caused by the difference in mechanism of generating the photocurrent for each of the light components. In the embodiment, the optical absorption layer 33 of the photodiode 25 has a type II quantum well structure including a III-V group compound semiconductor containing antimony as a constituent element. Specifically, the optical absorption layer 33 of the photodiode 25 has a GaAsSb/InGaAs type II multi quantum well structure. In this type II quantum well structure, the interband transition energy is reduced compared to a type I quantum well structure. Consequently, the optical absorption layer 33 absorbs near-infrared light having a wavelength of 1.7 to 2.5 μm, and the transition of electrons due to this light absorption (type II transition) generates a photocarrier (a pair of electron and hole). In FIG. 2, when light having a wavelength of 1960 nm or 2350 nm enters the optical absorption layer 33 of the photodiode 25, type II transition occurs in the GaAsSb/InGaAs type II multi quantum well structure so as to generate a photocarrier and a photocurrent.

In contrast, when light having a shorter wavelength of 1530 nm among the light components enters the stacked semiconductor layer 31, interband transition of electrons occurs in the InGaAs semiconductor layer included in the quantum well or the spacer layer so as to generate a photocurrent associated with this interband transition. For example, the band gap energy of the InGaAs layer lattice-matching with InP is about 0.728 (eV). This InGaAs layer has a sensitivity to light having a wavelength of, for example, 0.9 to 1.7 μm. In particular, the InGaAs layer has an effective sensitivity to light having a wavelength of 1.5 μm or less. In the embodiment, the sensitivity to the interband transition in this InGaAs layer is larger than the sensitivity in a type II band structure. For example, the sensitivity to the interband transition in the InGaAs semiconductor layer is 10 times or more the sensitivity to the interband transition to the type II band structure. In the embodiment, InGaAs semiconductor is used as the material for the spacer layer 39b shown in FIG. 1. Herein, the sensitivity is defined by the photocurrent generated by incidence of light having a light intensity per unit.

When light L contains light components having wavelengths of 1530 nm, 1960 nm, and 2350 nm, the photocurrent output from the photodiode 25 includes both photocurrent components. One of the photocurrent components is the type II transition component generated by the light components having wavelengths of 1960 nm and 2350 nm (hereinafter, referred to as the type II transition component). The other photocurrent component is the InGaAs interband transition component generated by the light component having a wavelength of 1530 nm (hereinafter, referred to as the InGaAs interband transition component).

Figure 3A:
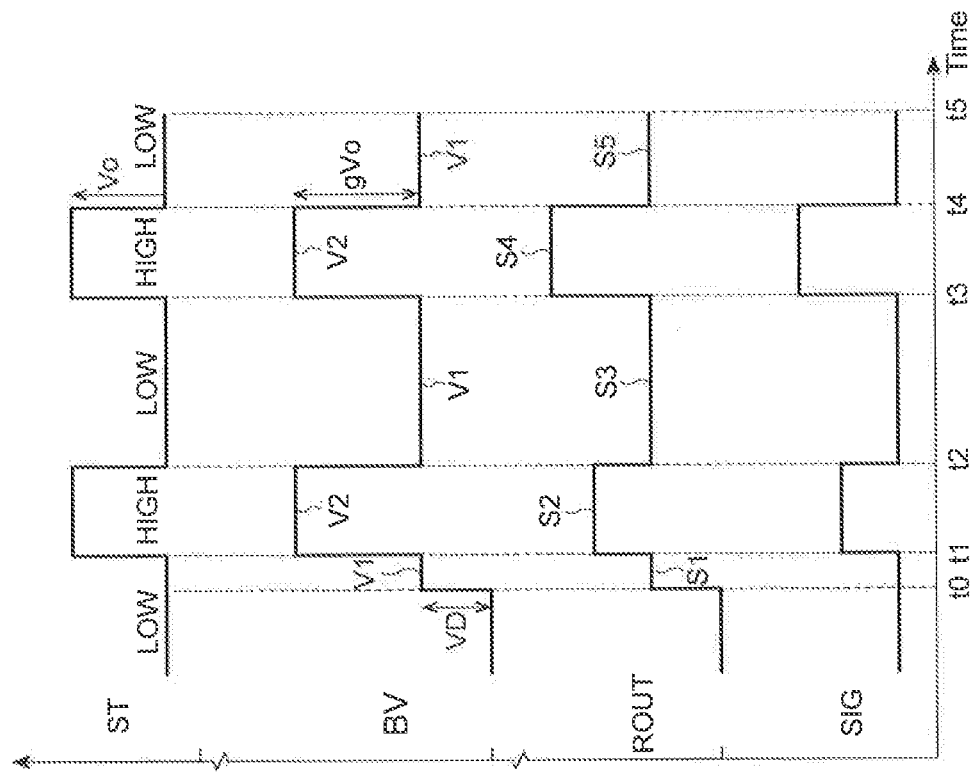
FIGS. 3A and 3B are diagrams showing a circuit block processing read-out signals and signal waveforms associated with the signal processing.
Figure 3B:
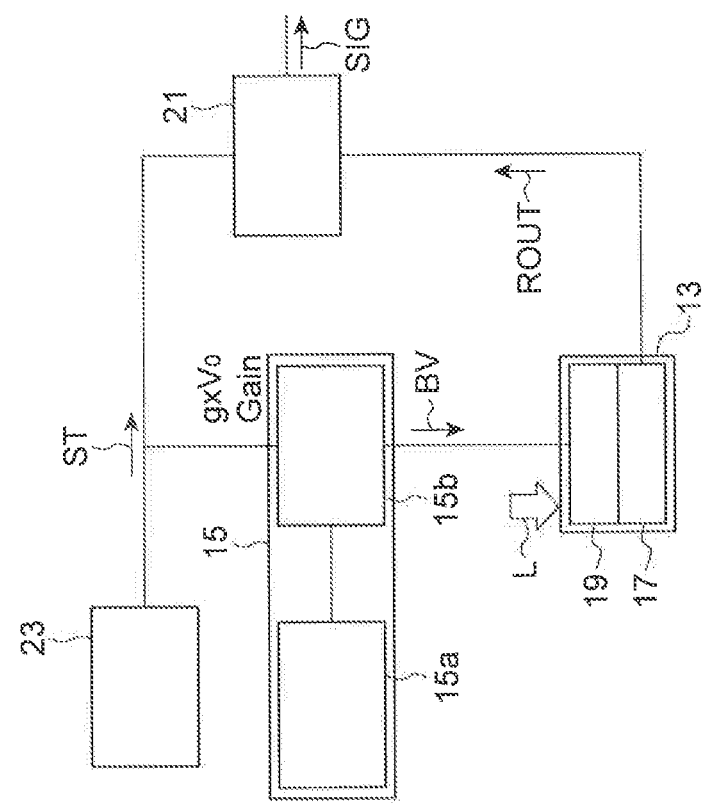

The modified bias voltage is applied to the photodiode 25, and the stacked semiconductor layer 31 having a type II quantum well structure is irradiated with light L. The photodiode 25 responds to the bias voltage and generates a photocurrent IL. FIGS. 3A and 3B are diagrams showing a circuit block processing read-out signals and signal waveforms obtained by the signal processing. As shown in FIG. 3A, the timing signal ST applied from the timing circuit 23 starts at time t0. In this Example, the initial value of the timing signal ST is LOW, and the value of the timing signal ST changes at time t1 from LOW to HIGH. The value of timing signal ST changes at time t2 from HIGH to LOW. The value of timing signal ST changes at time t3 from LOW to HIGH. The value of timing signal ST changes at time t4 from HIGH to LOW. The timing signal ST has an amplitude $V_0$. In the embodiment, the bias circuit 15 changes the timing signal ST at time t0 from reference voltage to voltage VD (=V1). The bias circuit 15, as shown in FIG. 3B, includes an analog bias control circuit 15a and an amplifier circuit 15b. The analog bias control circuit 15a provides a signal for adjusting the amplification degree (gain) g of the amplifier circuit 15b to the amplifier circuit 15b. Consequently, the bias circuit 15 generates a bias signal BV having a bias value (V2). The amplifier circuit 15b generates a voltage signal V2 from the amplitude $V_0$ of the timing signal ST and gain g of the amplifier circuit 15b. Here, the voltage signal V2 is equal to "$g \times V_0 + VD$", and VD is equal to V1.

With reference to FIG. 3A, the read-out signal ROUT from the light-receiving apparatus 13 has the following values:

| Term | Value of read-out signal ROUT |
|---|---|
| Term from time t0 to t1 | S1 |
| Term from time t1 to t2 | S2 |
| Term from time t2 to t3 | S3 |
| Term from time t3 to t4 | S4 |
| Term after time t4 | S5 |

Light L enters the stacked semiconductor layer 31 having a type II quantum well structure. The light L contains light components having wavelengths of 1530 nm, 1960 nm, and 2350 nm. The photocurrent IL from the stacked semiconductor layer 31 includes, for example, a type II transition component and an InGaAs interband transition component. The type II quantum well structure highly depends on the bias voltage. In this embodiment, the type II transition component of the photocurrent IL has a relatively low sensitivity at the first value V1 of the bias voltage BV and has a relatively high sensitivity at the second value V2 of the bias voltage BV. In contrast, the InGaAs interband transition component has very low (substantially zero) bias voltage dependence. In the read-out signal ROUT from the light-receiving apparatus 13, value S2 in the term from time t1 to t2 and value S4 in the term from time t3 to t4 include a greater amount of type II transition component compared to value S1 in the term from time t0 to t1, value S3 in the term from time t2 to t3, and value S5 in the term after time t4. More specifically, values S2 and S4 each contain a type II transition component, and values S1, S3, and S5 do not substantially contain any type II transition component. In the term from time t1 to t5, values S1 to S5 include substantially the same amount of InGaAs interband transition component.

The signal processing circuit 21 receives read-out signal ROUT and timing signal ST and processes the read-out signal ROUT synchronously with the timing signal ST. In processing the read-out signal ROUT in the signal processing circuit 21, values S2 and S4 in the read-out signal ROUT is extracted. The signal processing circuit 21 provides a difference between a read-out signal ROUT (value S1, S3, or S5) at a bias voltage of the first value V1 and a read-out signal ROUT (value S2 or S4) at a bias voltage of the second value V2 so as to output a differential signal SIG. For example, in the signal processing circuit 21, a signal including a type II transition component corresponding to the light component of a relatively long wavelength is provided by subtracting a value (S1, S3, or S5) from value S2 or S4. Here, the value (S1, S3, or S5) does not substantially change by changing the time or bias voltage and is also output in applying the first value V1 of the bias voltage BV.

FIGS. 4A to 4C show optical characteristics of a type II multi quantum well structure in the embodiment. FIG. 4A shows sensitivity characteristics of a light-receiving apparatus at four wavelengths of 1.29 μm, 1.53 μm, 1.96 μm, and 2.20 μm. This light-receiving apparatus includes a stacked semiconductor layer having a type II GaAsSb/InGaAs quantum well structure and including an InGaAs bulk layer. The sensitivity characteristics show that the InGaAs bulk layer has an effective sensitivity in a wavelength range of about 1.5 μm or less. In contrast, in a longer wavelength region than this wavelength, a type II GaAsSb/InGaAs quantum well structure has an effective sensitivity. FIG. 4B shows in more detail that in a single photodiode, a type II GaAsSb/InGaAs quantum well structure has an effective sensitivity in a wavelength of 1.9 to 2.5 μm (the range of 1.9 to 2.5 μm is measurement data). Although the lower limit of the wavelength data is 1.9 μm, as already described, the type II GaAsSb/InGaAs quantum well structure has a sensitivity to light having a shorter wavelength region than this lower limit of the wavelength data of 1.9 μm.

FIG. 4C shows the response characteristics of a light-receiving apparatus. The light-receiving apparatus outputs an electrical signal corresponding to the photocurrent from the photodiode for light in a wavelength range of 1.0 to 2.35 μm including four wavelengths of 1.29 μm, 1.53 μm, 1.96 μm, and 2.20 μm. In this wavelength range, a photocurrent is generated in a substantially linear relationship with an optical power of light incident on the light-receiving apparatus.

Referring to FIG. 1 again, the semiconductor light-receiving device 19 has a planar structure. The semiconductor light-receiving device 19 includes a so-called planar type photodiode 25, in this structure, semiconductor light-receiving device 19 includes a first conductive type spacer layer 39b disposed on an optical absorption layer 33, a cap layer 39a disposed on the spacer layer 39b, and second conductive type semiconductor regions 43 disposed in the cap layer 39a and the spacer layer 39b. A plurality of photodiodes 25 includes the common optical absorption layer 33, the common spacer layer 39b, and the common first conductive type cap layer 39a. Each of the second conductive type semiconductor regions 43 is extended from the cap layer 39a to the spacer layer 39b. In the first conductive type spacer layer 39b and cap layer 39a, each of the second conductive type semiconductor regions 43 defines at least one of the photodiodes 25 constituting an array. In the embodiment, the first conductive type is n-type, and the second conductive type is p-type. The semiconductor regions 43 are formed by, for example, thermal diffusion of a p-type impurity. The p-type dopant is, for example, zinc (Zn). The photodiodes 25 are electrically isolated from one another by p-n junctions disposed between the second conductive type semiconductor regions 43 and first conductive type semiconductor layers including the cap layer 39a and the spacer layer 39b.

Alternatively, the semiconductor light-receiving device may have a mesa-type structure. The semiconductor light-receiving device 19 includes an arrangement of semiconductor mesas that define the photodiodes 25, respectively. The semiconductor mesa includes a second conductive type spacer layer disposed on an optical absorption layer and a second conductive type cap layer disposed on the spacer layer. In this infrared image sensor, the semiconductor mesas isolate the photodiodes 25 from one another.

Although the principle of the present invention has been illustrated and described based on preferred embodiments, it is recognized by those skilled in the art that the present invention can be modified in arrangement and detail without departing from such principle. The present invention is not limited to the specific structures disclosed in the embodiments. Accordingly, it is intended to include all modifications and changes which are within the scope of the claims and the spirit thereof.

What is claimed is:

1. An infrared image sensor comprising:
a bias circuit receiving a timing signal, the bias circuit generating a bias voltage having a first value and a second value in response to the timing signal;
a semiconductor light-receiving device including a photodiode provided by a semiconductor mesa disposed on a first conductive type semiconductor substrate, the semiconductor light-receiving device receiving the bias voltage;
a read-out circuit including a read-out electrode connected to the photodiode, the read-out electrode receiving an electrical signal from the photodiode; and
a signal processing circuit processing a read-out signal from the read-out circuit synchronously with the timing signal, wherein
the semiconductor mesa of the photodiode includes an optical absorption layer made of a III-V group compound semiconductor, a second conductive type spacer layer disposed on the optical absorption layer, and a second conductive type cap layer disposed on the spacer layer; and
the optical absorption layer has a type II multi quantum well structure including first compound semiconductor layers containing antimony as a constituent element and second compound semiconductor layers that are stacked alternately.

2. The infrared image sensor according to claim 1, wherein
the optical absorption layer generates a photocurrent component due to a type II transition in the type II multi quantum well structure;
the photocurrent component due to the type II transition varies according to the first value and the second value of the bias voltage applied to the photodiode; and
the signal processing circuit provides a difference between a read-out signal at a bias voltage of the first value and a read-out signal at a bias voltage of the second value so as to output a differential signal.

3. The infrared image sensor according to claim 1, wherein
the first compound semiconductor layers are made of GaAsSb; and
the second compound semiconductor layers are made of InGaAs.

4. The infrared image sensor according to claim 1, wherein
the spacer layer is made of InGaAs; and
the cap layer is made of InP.

5. An infrared image sensor comprising:
a bias circuit receiving a timing signal, the bias circuit generative a bias voltage having a first value and a second value in response to the timing signal;
a semiconductor light-receiving device including a photodiode, the semiconductor light-receiving device receiving the bias voltage;
a read-out circuit including a read-out electrode connected to the photodiode, the read-out electrode receiving an electrical signal from the photodiode; and
a signal processing circuit processing a read-out signal from the read-out circuit synchronously with the timing signal, wherein
the photodiode has an optical absorption layer made of a III-V group compound semiconductor;
the semiconductor light-receiving device includes a first conductive type semiconductor substrate, a first conductive type spacer layer disposed on the optical absorption layer, a first conductive type cap layer disposed on the spacer layer, and a second conductive type semiconductor region disposed in the spacer layer and the cap layer;
the optical absorption layer is disposed between the semiconductor substrate and the spacer layer and has a type II multi quantum well structure including first compound semiconductor layers containing antimony as a constituent element and second compound semiconductor layers that are stacked alternately; and
the second conductive type semiconductor region extends from the cap layer to the spacer layer, the second conductive type semiconductor region defining the photodiode.

6. The infrared image sensor according to claim 5, wherein
the second conductive type semiconductor region is formed by impurity diffusion of a p-type dopant.

7. The infrared image sensor according to claim 5, wherein
the spacer layer is made of InGaAs; and
the cap layer is made of InP.

8. The infrared image sensor according to claim 5, wherein
the optical absorption layer generates a photocurrent component due to a type II transition in the type II multi quantum well structure;
the photocurrent component due to the type II transition varies according to the first value and the second value of the bias voltage applied to the photodiode; and
the signal processing circuit provides a difference between a read-out signal at a bias voltage of the first value and a read-out signal at a bias voltage of the second value so as to output a differential signal.

9. The infrared image sensor according to claim 5, wherein
the first compound semiconductor layers are made of GaAsSb; and
the second compound semiconductor layers are made of InGaAs.

10. An infrared image sensor comprising:
a bias circuit receiving a timing signal, the bias circuit generating a bias voltage having a first value and a second value in response to the timing signal;
a semiconductor light-receiving device including a plurality of photodiodes arranged one-dimensionally or two-dimensionally in an array, the semiconductor light-receiving device receiving the bias voltage;
a read-out circuit including a plurality of read-out electrodes corresponding to the plurality of photodiodes, each of the read-out electrodes being connected to one of the photodiodes and receiving an electrical signal from the photodiode to which it is connected; and
a signal processing circuit processing read-out signals from the read-out circuit synchronously with the timing signal, wherein
each photodiode includes an optical absorption layer made of a III-V group compound semiconductor, the optical absorption layer having a type II multi quantum well structure including first compound semiconductor layers containing antimony as a constituent element and second compound semiconductor layers that are stacked alternately,
the semiconductor light-receiving device includes a plurality of semiconductor mesas disposed on a first conductive type semiconductor substrate, each of the semiconductor mesas defining at least one of the plurality of photodiodes, and
each semiconductor mesa includes a second conductive type spacer layer disposed on the optical absorption layer of the at least one photodiode defined thereby and a second conductive type cap layer disposed on the spacer layer.

11. An infrared image sensor comprising:
a bias circuit receiving a timing signal, the bias circuit generating a bias voltage having a first value and a second value in response to the timing signal;
a semiconductor light-receiving device including a plurality of photodiodes arranged one-dimensionally or two-dimensionally in an array, the semiconductor light-receiving device receiving the bias voltage;
a read-out circuit including a plurality of read-out electrodes corresponding to the plurality of photodiodes, each of the read-out electrodes being connected to one of the photodiodes and receiving an electrical signal from the photodiode to which it is connected; and
a signal processing circuit processing read-out signals from the read-out circuit synchronously with the timing signal, wherein
a common optical absorption layer is common to each photodiode of the plurality of photodiodes, the optical absorption layer being of a III-V group compound semiconductor and having a type II multi quantum well structure including first compound semiconductor layers containing antimony as a constituent element and second compound semiconductor layers that are stacked alternately;
an optical absorption layer provides a III-V group compound semiconductor for each photodiode, the optical absorption layer having a type II multi quantum well structure including first compound semiconductor layers containing antimony as a constituent element and second compound semiconductor layers that are stacked alternately;
the semiconductor light-receiving device includes a first conductive type semiconductor substrate, a first conductive type spacer layer disposed on the optical absorption layer, a first conductive type cap layer disposed on the spacer layer, and a plurality of second conductive type semiconductor regions disposed in the spacer layer and the cap layer;
the optical absorption layer is disposed between the semiconductor substrate and the spacer layer;
each of the second conductive type semiconductor regions extends from the cap layer to the spacer layer, each of the second conductive type semiconductor regions defining at least one of the plurality of photodiodes; and
the photodiodes are electrically isolated from one another by p-n junctions disposed between the second conductive type semiconductor regions and first conductive type semiconductor layers that include the cap layer and the spacer layer.

* * * * *